(12) United States Patent
Lurkins

(10) Patent No.: US 6,964,002 B2
(45) Date of Patent: Nov. 8, 2005

(54) SCAN CHAIN DESIGN USING SKEWED CLOCKS

(75) Inventor: Joel Lurkins, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 422 days.

(21) Appl. No.: 10/284,008

(22) Filed: Oct. 30, 2002

(65) Prior Publication Data

US 2004/0088618 A1    May 6, 2004

(51) Int. Cl.[7] .......................................... G01R 31/28
(52) U.S. Cl. ...................... 714/731; 714/726
(58) Field of Search ................ 714/730, 731, 714/733, 726, 727, 729; 327/239, 259; 377/69

(56) References Cited

U.S. PATENT DOCUMENTS

| | | | |
|---|---|---|---|
| 5,347,523 A * | 9/1994 | Khatri et al. ............... | 714/730 |
| 5,444,405 A * | 8/1995 | Truong et al. .............. | 327/239 |
| 5,689,517 A * | 11/1997 | Ruparel ..................... | 714/731 |
| 5,701,335 A * | 12/1997 | Neudeck ..................... | 377/69 |
| 5,818,276 A * | 10/1998 | Garrity et al. .............. | 327/259 |
| 6,816,991 B2 * | 11/2004 | Sanghani ..................... | 714/733 |

* cited by examiner

Primary Examiner—David Ton
(74) Attorney, Agent, or Firm—Conley Rose, P.C.

(57) ABSTRACT

A scan chain comprising a series of flip-flops and two clock signals, where each clock signal is coupled to alternating flip-flops in the series. The second clock signal is typically 180 degrees out of phase with the first clock signal. The two clock signals may be generated from a base clock signal that is coupled to two clocking devices. The first clock signal is output from one clocking device and the second clock signal is output from the other. One clocking device typically passes the base clock signal without delay and the second typically delays it. The clocking devices may be MUXes that can be switched to place the clock signals in or out of phase. The scan chain can be incorporated within an integrated circuit wherein the clock signals are out of phase during testing of the integrated circuit and are in phase after testing of the integrated circuit is complete.

23 Claims, 2 Drawing Sheets

SCAN CHAIN DESIGN USING SKEWED CLOCKS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to scan chains used in testing integrated circuits and more particularly to a method and apparatus for preventing a race condition in a scan chain.

2. Background of the Invention

Scan chains are sometimes embedded in integrated circuit chips to facilitate testing of the chips prior to their delivery to a customer. A scan chain is a set of flip-flops connected in-a serial fashion. To test an integrated circuit by means of a scan chain, a pattern of data is serially clocked into the chain of flip-flops. On the first clock pulse of a series of clock pulses, the first flip-flop in the chain accepts a data bit; that is, a bit of data moves from the input to the output of the flip-flop. Since the output of the first flip-flop is the input of the second flip-flop, the first bit of data is then present at the input of the second flip-flop. At the second clock pulse, the data bit that was at the input of the second flip-flop moves to the output of that flip-flop and the first flip-flop accepts a new bit of data. Data continues to move in this manner through the chain of flip-flops until the first bit of data reaches the last flip-flop. This serial input of data into a scan chain is known as the shift mode.

After the shift mode is complete, the scan chain can enter the capture mode. In capture mode, the data bits at the outputs of the flip-flops are moved in parallel fashion into the logic circuits of the integrated circuit chip. The logic circuits then manipulate the data and the resulting data is moved in parallel fashion back to the flip-flops. A shift mode is then re-entered and the data is shifted out of the flip-flops one bit at a time in a manner similar to the way data was shifted in. The data that is shifted out of the flip-flops can be compared to the data that was shifted in to determine if the integrated circuit logic performed as expected in manipulating the data.

An undesirable situation known as a race condition can occur when data is serially clocked into a scan chain during shift mode. That is, due to the different path lengths the clock signal must traverse to reach the different flip-flops in a scan chain, a clock pulse may not reach a flip-flop in time for the pulse to cause the correct data bit to be passed from the input to the output of the flip-flop. A first bit of data at the input of a flip-flop could be overwritten by a second bit of data if the second bit arrives at the input of the flip-flop before the arrival of the clock pulse that is intended to move the first bit from the input to the output of the flip-flop. This would cause the second bit rather than the first bit to be passed from the input to the output of the flip-flop, a possibly undesirable result.

For example, if two bits of data that can be labeled A and B are to be shifted into a scan chain consisting of two flip-flops, a desired outcome of the shift mode might be that bit A is at the output of the second flip-flop and bit B is at the output of the first flip-flop. On the first clock pulse, bit A is moved from the input to the output of the first flip-flop. Bit A is then immediately available at the input of the second flip-flop. If no race condition exists, the next clock pulse will reach both flip-flops simultaneously. Bit A will then be moved from the input to the output of the second flip-flop and bit B will be moved from the input to the output of the first flip-flop. This results in the desired state of bit A at the output of the second flip-flop and bit B at the output of the first flip-flop. However, if a race condition does exist, the second clock pulse might not reach the second flip-flop until a significant time after it has reached the first flip-flop. In this case, the second clock pulse might cause bit B to pass from the input of the first flip-flop to the output of the first flip-flop and on to the input of the second flip-flop before the second clock pulse reaches the second flip-flop. If this happens, bit B will overwrite bit A at the input of the second flip-flop and will be waiting at the input of the second flip-flop for the second clock pulse. When the second clock pulse reaches the second flip-flop, bit B will pass from the input to the output of the second flip-flop. At the end of two clock cycles, then, bit B will be present at the outputs of both flip-flops. These values at the outputs of the flip-flops do not correspond to the desired outcome.

BRIEF SUMMARY OF THE INVENTION

An embodiment of the present invention is a scan chain comprising a series of flip-flops coupled serially such that the output of the preceding flip-flop is coupled to the input of the succeeding flip-flop. A first clock signal is coupled to every other flip-flop in the series and a second clock signal is coupled to every other remaining flip-flop in the series not coupled to the first clock signal. The second clock signal can be out of phase with the first clock signal and is typically about 180 degrees out of phase with the first clock signal. The first and second clock signals can be generated from the same base clock signal. The base clock signal can be coupled to a first and second clocking device such that the first clock signal is output from the first clocking device and the second clock signal is output from the second clocking device. The second clocking device can delay the base clock signal so that the second clock signal is out of phase with the base clock signal. The first clocking device can pass the base clock signal without delay so that the first clock signal is out of phase with the second clock signal. Each of the clocking devices may comprise a MUX which may be switched such that the first and second clock signals are either in or out of phase. The scan chain can be incorporated in an integrated circuit wherein the first and second clock signals are out of phase when the scan chain is used to test the integrated circuit and are switched in phase after testing of the integrated circuit is complete.

Another embodiment is a computer system having an integrated circuit that comprises circuitry to perform a certain function in the computer system and a scan chain coupled to the circuitry to test the circuitry. The scan chain typically comprises a series of flip-flops coupled serially such that the output of the preceding flip-flop is coupled to the input of the succeeding flip-flop, a first clock signal coupled to every other flip-flop in the series, and a second clock signal coupled to every other remaining flip-flop in the series not coupled to the first clock signal. The second clock signal is typically out of phase with the first clock signal. The system can further comprise a first clocking device to generate the first clock signal and a second clocking device to generate the second clock signal and can further comprise a clock to generate a base clock signal that is sent to each clocking device. The system can further comprise a switch within each clocking device that can send the base clock signal through one of two paths. One of the two paths can include a delaying unit that can delay the transmission of a clock signal. The delaying unit typically delays one clock signal so that the clock signal is approximately 180 degrees out of phase with the other clock signal. The clocking devices may be MUXes.

Yet another embodiment is a method of loading a scan chain to prevent race conditions that comprises sending a first clock signal to a first flip-flop in a scan chain and sending a second clock signal to a second flip-flop in a scan chain. The first and second clock signals are out of phase with each other and are typically approximately 180 degrees out of phase with each other. The first clock signal is typically sent from a first clocking device and the second clock signal is typically sent from a second clocking device. The clocking devices can include switches that allow an input clock signal to pass unaltered in one switch position and to be delayed in another switch position. The clocking devices may be MUXes.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, components may be referred to by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections. For purposes of this specification, components may respond to a rising or a falling edge of the clock signal so the term "clock pulse" is used generally to refer to either a rising or falling edge within the clock signal.

DETAILED DESCRIPTION OF EMBODIMENTS

Figure 1:
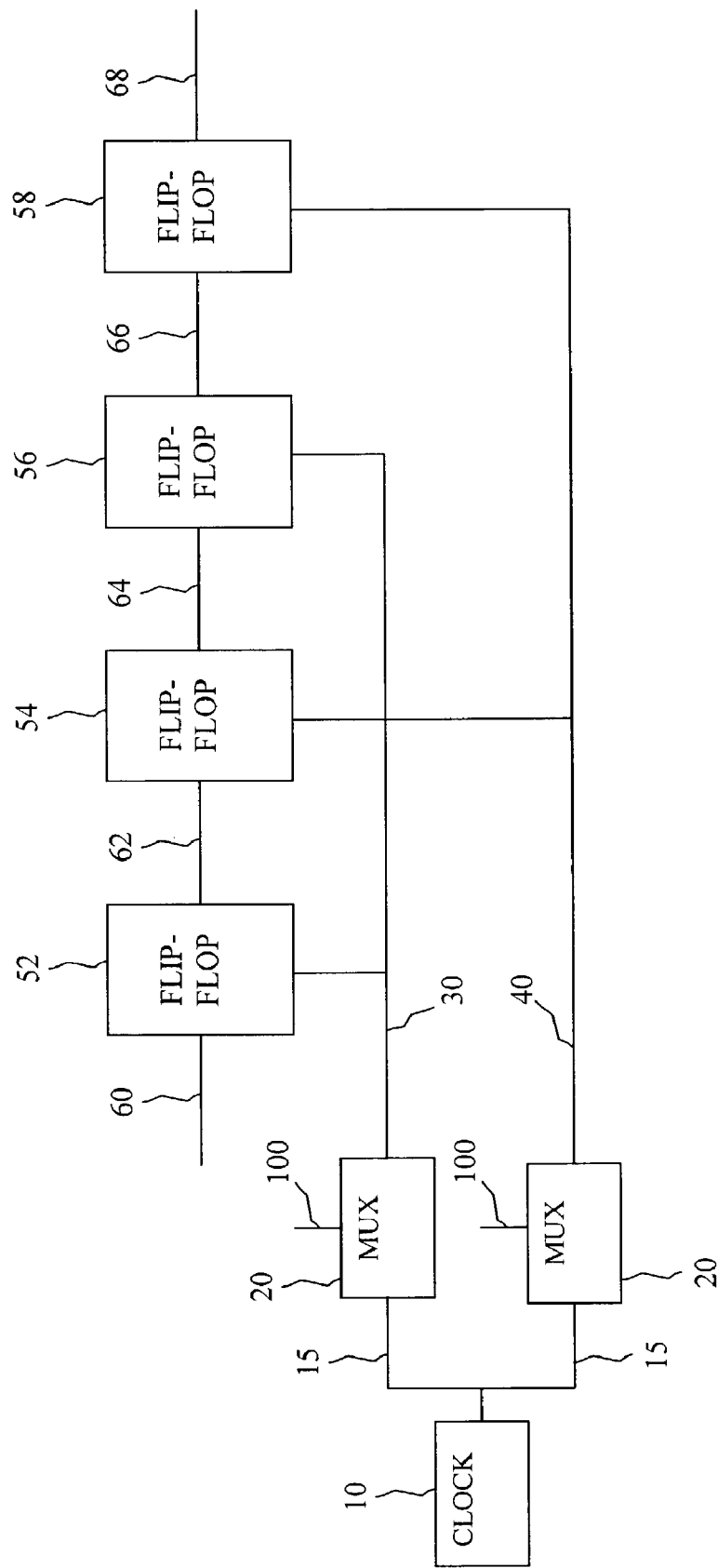
FIG. 1 is a block diagram of an embodiment of the invention.

Embodiments of the invention relate to a method and apparatus for preventing a race condition in a scan chain. An embodiment is shown in FIG. 1. A base clock signal from a clock 10 is split into two branches 15 each of which enters a clocking device 20. As described in more detail below, each clocking device 20 can either pass the clock signal on unchanged or can delay the clock signal so that the clock signal that is output from the clocking device 20 is approximately 180 degrees out of phase with the clock signal that was input into the clocking device 20. In the embodiment of FIG. 1, the clocking devices 20 are multiplexers or MUXes. One MUX 20 passes the clock on unchanged and the other MUX 20 delays the clock signal. This results in a clocking pattern similar to that shown in FIG. 2 where clock signal 80 can be seen to be approximately 180 degrees out of phase with clock signal 70. Clock signal 70 in FIG. 2 can be assumed to be present on connection 30 in FIG. 1 and clock signal 80 in FIG. 2 can be assumed to be present on connection 40 in FIG. 1. Connection 30 couples a first MUX 20 to flip-flops 52 and 56. Connection 40 couples a second MUX 20 to flip-flops 54 and 58. Flip-flops 52, 54, 56, and 58 comprise a scan chain.

A string of data can enter the chain of flip-flops 52, 54, 56, and 58 through connection 60. The output of flip-flop 52 is coupled to the input of flip-flop 54 by connection 62, the output of flip-flop 54 is coupled to the input of flip-flop 56 by connection 64, and the output of flip-flop 56 is coupled to the input of flip-flop 58 by connection 66. The output of flip-flop 58 is present on connection 68. If further flip-flops were needed in the scan chain, they could be connected to the output of flip-flop 58 via connection 68.

In an embodiment of the invention, if it is desired that a four-bit string of data is to be shifted into the scan chain comprised by flip-flops 52, 54, 56, and 58, the first bit to enter the chain can be referred to as A, the second as B, the third as C, and the fourth as D. Before the clock signals 70 and 80 begin reaching flip-flops 52, 54, 56, and 58, data bit A would be present on connection 60 at the input of flip-flop 52 and unknown values would be present at the outputs 62, 64, 66, and 68 of flip-flops 52, 54, 56, and 58. When the first clock pulse of clock signal 70 (for example pulse 72 of FIG. 2) reaches flip-flop 52 via connection 30, data bit A passes to the output 62 of flip-flop 52. This is also the input 62 of flip-flop 54. Before another clock pulse occurs on clock signal 70, a clock pulse (for example clock pulse 82) occurs on clock signal 80. This clock pulse is transmitted via connection 40 to flip-flop 54. Upon receiving this clock pulse, flip-flop 54 passes the data on its input 62 (namely, data bit A) to its output 64. At this point, then, data bit A is present on outputs 62 and 64, unknown values are still present on outputs 66 and 68, and data bit B is at the input of flip-flop 52 awaiting another clock pulse to arrive at flip-flop 52.

When the next clock pulse (such as pulse 74) of clock signal 70 reaches flip-flop 52 via connection 30, data bit B passes to the output 62 of flip-flop 52 and the input 62 of flip-flop 54. Clock pulse 74 also travels via connection 30 to flip-flop 56 where it causes the data at the input 64 of flip-flop 56 (namely data bit A) to pass to the output 66 of flip-flop 56. This is also the input 66 of flip-flop 58. Now, data bit B is present on output 62 and data bit A is present on outputs 64 and 66.

Next, another clock pulse (such as pulse 84) occurs on clock signal 80 and is passed by connection 40 to flip-flops 54 and 58. This causes data bit B at the input 62 of flip-flop 54 to pass to the output 64 of flip-flop 54 and data bit A at the input 66 of flip-flop 58 to pass to the output 68 of flip-flop 58. Data bit B is now on outputs 62 and 64 and data bit A is on outputs 66 and 68. If the above process continues for clock pulses 76, 86, 78, and 88, data bits C and D will move through flip-flops 52, 54, 56, and 58 in a similar manner.

After the entire data string that was originally on input 60 has been serially entered into the scan chain in the manner described above, the data on the outputs of the scan chain can be sent in a parallel fashion to the logic circuitry of the integrated circuit chip in which the scan chain is embedded. The chip's logic performs its normal data manipulation and the resulting data is sent back to the scan chain in parallel fashion. The data can then be removed from the scan chain serially in a manner similar to that described above and compared to the expected results.

Figure 2:
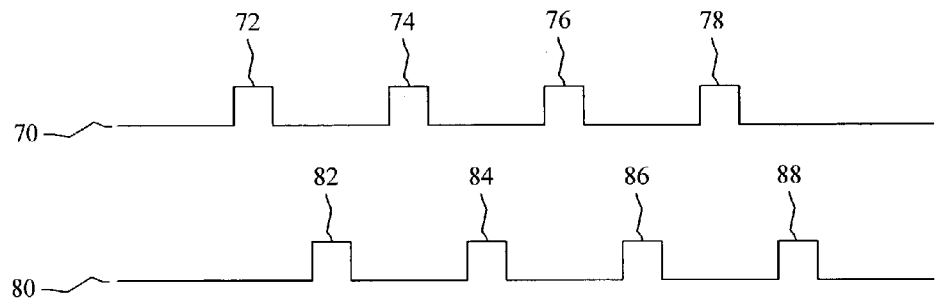
FIG. 2 is a block diagram of two clock signals used by an embodiment of the invention.

If the clock signals are 180 degrees out of phase as shown in FIG. 2 and if alternating flip-flops receive clock pulses from alternating clock signals, a race condition cannot occur in a scan chain. After a data bit passes from the input to the output of a flip-flop upon a clock pulse reaching that flip-flop, the data bit is held at the input of the succeeding flip-flop in the scan chain until a clock pulse from the other clock signal reaches the succeeding flip-flop. As long as a sufficient time passes between a clock pulse from one clock signal and a clock pulse from the other clock signal, the appropriate data bit will always be present at the input of a flip-flop when a clock pulse arrives. Since the maximum possible time between a clock pulse from one clock signal and a clock pulse from the other clock signal occurs when the clock signals are 180 degrees out of phase, it is typically desirable that the clock signals be as close as possible to 180 degrees out of phase. If the clock signals are not 180 degrees out of phase and the path lengths the clock signals must traverse are extremely different, a race condition could eventually result in the scan chain.

If the above example of data bits A, B, C, and D being clocked into flip-flops 52, 54, 56, and 58 by clock signals 70 and 80 is continued to its conclusion, it will be seen that data bit D will be present on outputs 62 and 64 and data bit C will be present on outputs 66 and 68 at the end of the process. Thus, in this example, data bits A and B from the original input data string are lost and data bits C and D are duplicated. In actual embodiments of the invention this situation can be avoided by manipulating the length and data pattern of the input data string, the number of flip-flops in the scan chain, and the sequence of flip-flops that send data to the surrounding integrated circuit logic. When these parameters are properly specified (for example, by ensuring that the number of flip-flops in the scan chain is twice the number of bits in the input data string) any desired data pattern can be placed on the outputs of the flip-flops and sent to the integrated circuit logic.

Figure 3:
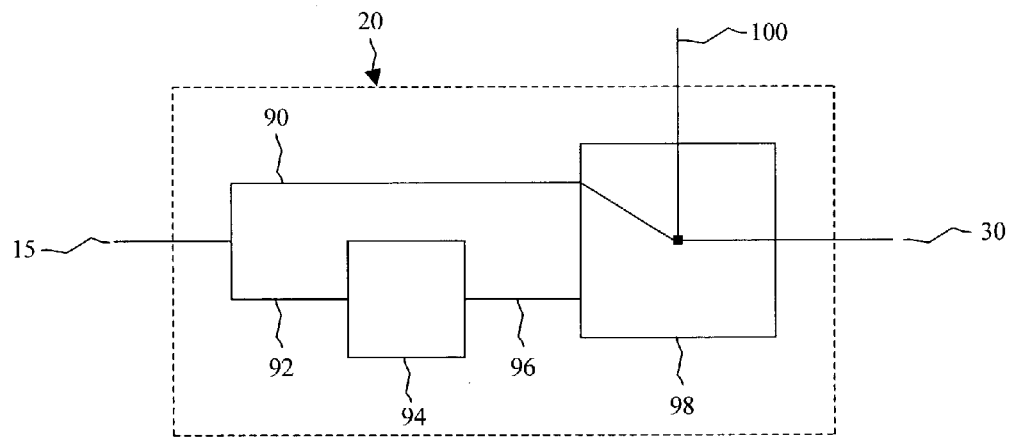
FIG. 3 is a block diagram of a clocking device used by an embodiment of the invention.

A detailed view of a clocking device or MUX 20 from FIG. 1 is shown in FIG. 3. A base clock signal enters the MUX 20 on connection 15 and is split into two branches 90 and 92. Branch 90 goes directly into a switch 98 while branch 92 enters a delaying unit 94. The delaying unit 94 can be a delay cell, an inverter, or other mechanism that retains the shape and frequency of the clock signal but produces an output signal that is out of phase with the input signal. It is desirable that the output signal be 180 degrees out of phase with the input signal. The delayed signal from the delaying unit 94 enters switch 98 via connection 96. A selection line 100 allows a user to set switch 98 so that either the undelayed clock signal from connection 90 or the delayed clock signal from connection 96 is placed on output 30.

In the embodiment of FIG. 1, one MUX 20 could be selected to place an undelayed clock signal such as clock signal 70 on connection 30 and the other MUX 20 could be selected to place a delayed clock signal such as clock signal 80 on connection 40. A scan chain within an integrated circuit chip is no longer used after testing is complete and the chip is ready to be delivered to a customer. Therefore, before a chip is placed into a customer application, both MUXes 20 are selected to produce the same clock signal for their output. For example, both MUXes 20 would typically be set to output the undelayed signal on connection 90 in FIG. 3.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A scan chain comprising:
    a series of flip-flops coupled serially such that the output of the preceding flip-flop is coupled to the input of the succeeding flip-flop;
    a first clock signal coupled to every other flip-flop in the series;
    a second clock signal coupled to every other remaining flip-flop in the series not coupled to the first clock signal;
    a clock system for generating the first and second clock signals, the clock system configured to selectively generate the first and second clock signals as a pair of in-phase clock signals or as a pair of out-of-phase clock signals.

2. The scan chain of claim 1, wherein the second clock signal is about 180 degrees out of phase with the first clock signal.

3. The scan chain of claim 1, wherein the first and second clock signal are generated from the same base clock signal.

4. The scan chain of claim 3, wherein the clock system further comprises first and second clocking devices and wherein the base clock signal is coupled to the first and second clocking devices such that the first clock signal is output from the first clocking device and the second clock signal is output from the second clocking device.

5. The scan chain of claim 4, wherein the second clocking device delays the base clock signal such that the second clock signal is out of phase with the base clock signal.

6. The scan chain of claim 5, wherein the first clocking device passes the base clock signal with about no delay such that the first clock signal is out of phase with the second clock signal.

7. The scan chain of claim 6, wherein the second clock signal is about 180 degrees out of phase with the first clock signal.

8. The scan chain of claim 4, wherein each one of the clocking devices comprise a MUX.

9. A scan chain comprising:
    a series of flip-flops coupled serially such that the output of the preceding flip-flop is coupled to the input of the succeeding flip-flop;
    a first clocking device for transmitting a first clock signal to every other flip-flop in the series;
    a second clocking device for transmitting a second clock signal to every other remaining flip-flop in the series, the second clock signal being out of phase with the first clock signal;
    the first and second clock signals generated from a common base clock signal;
    wherein each one of the clocking devices comprise a MUX and the MUX can be switched such that the first and second clock signals are in phase.

10. A scan chain, comprising:
    a series of flip-flops coupled serially such that the output of the preceding flip-flop is coupled to the input of the succeeding flip-flop;

a first clock signal coupled to every other flip-flop in the series;

a second clock signal coupled to every other remaining flip-flop in the series not coupled to the first clock signal;

wherein the scan chain is incorporated within an integrated circuit and wherein the first and second clock signals are out of phase when the scan chain is used to test the integrated circuit and are switched in phase after testing of the integrated circuit is complete.

11. A computer system comprising:

circuitry to perform a certain function in the computer system; and a scan chain coupled to said circuitry to test the circuitry, comprising:

a series of flip-flops coupled serially such that the output of the preceding flip-flop is coupled to the input of the succeeding flip-flop;

a first clock signal coupled to every other flip-flop in the series;

a second clock signal coupled to every other remaining flip-flop in the series not coupled to the first clock signal;

wherein the second clock signal is out of phase with the first clock signal when the scan chain is testing the circuitry and wherein the second clock signal is in phase with the first clock signal when the scan chain is not testing said circuitry.

12. The system of claim 11 further comprising a first clocking device to generate the first clock signal and a second clocking device to generate the second clock signal.

13. The system of claim 12 further comprising a clock to generate a base clock signal that is sent to each clocking device.

14. A computer system comprising:

circuitry to perform a certain function in the computer system; and a scan chain coupled to said circuitry to test the circuitry, comprising:

a series of flip-flops coupled serially such that the output of the preceding flip-flop is coupled to the input of the succeeding flip-flop;

a first clocking device for generating a first clock signal coupled to every other flip-flop in the series;

a second clocking device for generating a second clock signal coupled to every other remaining flip-flop in the series not coupled to the first clock signal; and a clock for generating a base clock signal that is sent to each clocking device;

a switch within each clocking device that can send the base clock signal on one of two paths through the clocking device.

15. The system of claim 14 wherein one of the two paths includes a delaying unit that can delay the transmission of a clock signal.

16. The system of claim 15 wherein the delaying unit delays the base clock signal so that the clock signal is approximately 180 degrees out of phase with the original clock base clock signal.

17. The system of claim 16 wherein each of the clocking devices comprises a MUX.

18. The method of claim 14, wherein the second clock signal is out of phase with the first clock signal.

19. A method of testing an electronic system using a scan chain comprising:

providing a scan chain coupled to circuitry in an electronic system;

sending a first clock signal to a first flip-flop in the scan chain;

sending a second clock signal to a second flip-flop in the scan chain; and shifting data into the scan chain; wherein:

upon commencement of the testing of the electronic system, switching the first and second clock signals to be out of phase with one another; and upon completion of the testing of the electronic system, switching the first and second clock signals to be in phase with one another.

20. The method of claim 19 further comprising inputting data from the scan chain into circuitry within the electronic system for processing.

21. The method of claim 20 further comprising outputting data from the circuitry to the scan chain.

22. The method of claim 21 further comprising shifting data out of the scan chain.

23. The method of claim 22, further comprising comparing the data output from the scan chain to expected results.

* * * * *